United States Patent
Heaton et al.

[11] Patent Number: 5,103,169
[45] Date of Patent: Apr. 7, 1992

[54] RELAYLESS INTERCONNECTIONS IN HIGH PERFORMANCE SIGNAL PATHS

[75] Inventors: Dale A. Heaton, Garland; James E. Bartling, Allen, both of Tex.

[73] Assignee: Texas Instruments Incorporated, Dallas, Tex.

[21] Appl. No.: 436,844

[22] Filed: Nov. 15, 1989

[51] Int. Cl.⁵ .......................................... G01R 13/00
[52] U.S. Cl. ................................................ 324/158 R
[58] Field of Search ............. 324/158 F, 158 R, 158 T, 324/158 P, 73.1; 371/15.1; 357/51; 307/243, 570, 72

[56] References Cited
U.S. PATENT DOCUMENTS

| | | | |
|---|---|---|---|
| 3,976,940 | 8/1976 | Chau et al. | 371/22.1 |
| 4,102,491 | 7/1978 | DeVito et al. | 371/15.1 |
| 4,300,207 | 11/1981 | Eivers et al. | 324/73.1 |
| 4,422,040 | 12/1983 | Raider et al. | 324/158 MG |
| 4,460,998 | 7/1984 | Yamada et al. | 371/10.3 |
| 4,484,329 | 11/1984 | Slamka et al. | 371/22.6 |
| 4,631,698 | 12/1986 | Walsh et al. | 371/20.1 |
| 4,785,207 | 11/1988 | Eng | 307/570 |
| 4,893,159 | 1/1990 | Suzuki et al. | 357/51 |
| 4,920,388 | 4/1990 | Blanchard et al. | 357/51 |

Primary Examiner—Kenneth A. Wieder
Assistant Examiner—B. Burns
Attorney, Agent, or Firm—B. Peter Barndt; Richard Donaldson; William E. Hiller

[57] ABSTRACT

Field Effect Transistors are used to replace mechanical relays and to minimize the distance a Device Under Test (DUT) must drive a signal path to the receiver, to minimize insertion losses in critical paths to the DUT, and generally increase reliability in integrated test systems by eliminating the need for relays to test integrated circuits.

17 Claims, 3 Drawing Sheets

RELAYLESS INTERCONNECTIONS IN HIGH PERFORMANCE SIGNAL PATHS

FIELD OF THE INVENTION

This invention relates to integrated circuit testers, and more particularly to relayless interconnections in high performance signal paths in such testers.

BACKGROUND OF THE INVENTION

In a test system there are many sources of timing errors. One such error that can not normally be corrected for in timing calibration is the mismatch in impedance between the output impedance of the device under test (DUT) and impedance of the signal path from the DUT to the receiver. Typically, the distance between the DUT and receiver is anywhere from 6 to 18 inches. If the output impedance of the DUT is greater than the signal path impedance, the output pulse of the DUT will appear rolled-off. The signal is rolled-off due to reflections caused by mismatch in impedance. Since a signal travels approximately 12 inches in 1.8 ns, the round trip delay can introduce a maximum error from 1.8 ns to 5.4 ns to the receiver.

By reducing the distance to 2 inches or less, the maximum error introduced about be 600 ps. If the output impedance of the DUT is smaller than the impedance of the signal path, a ringing or oscillation will occur. This oscillation will trip the receiver multiple times, making the functional testing of the DUT difficult to be performed at the device specification. The cycle of oscillation is dependent on the distance between the DUT and receiver. Depending on the magnitude of the impedance mismatch, it can take up to 4 cycles for the oscillation to dampen out. For distances of 6 to 18 inches, the time for damping is from 7.2 ns to 21 ns. For 2 inches or less, this time is 2.4 ns or less.

Relays in the high speed paths of testers also introduce insertion loss errors. Relays exhibit 0.3 db loss at 200 mhz. This relates to approximately 4% signal degradation.

Relays are also inherently unreliable with a typical life time of 10 exp8 switching cycles.

By using FETS to replace relays in the critical device signal paths, a short distance of two (2) inches or less (based on a 256 pin test head) can be achieved to the DUT. Relays can also be eliminated from the high speed and high usage paths to increase signal integrity and reliability.

There are three (3) major reasons FETs have not been used instead of relays in the past; 1) the leakage current of silicon FETs introduce errors when the DUT bias currents (IIN) are measured. This leakage is very difficult to calibrate out of the actual bias current of the DUT. The leakage also increases as the size of the FET increases to reduce the "ON" resistance of the FET. Low "ON" resistances of the FET are necessary to force high current for DUT voltage output measurements (VOL, VOH); 2) The lumped capacitance of FETs can also introduce insertion loss errors and limit frequency response of the DUT and tester electronics. The lumped capacitance of a FET increases as the size of the FET increases to reduce the "ON" resistance. Low "ON" resistance is also necessary to improve frequency response. 3) GaAs MESFETs have a much lower capacitance than silicon FETs, but the leakage current is much higher.

BRIEF SUMMARY OF THE INVENTION

The invention uses biasing and isolation circuits to overcome the limitations caused by using FETs.

Using silicon EFETs (or JFETs), a biasing scheme for the substrate and gate of the EFETs is used to maintain a low and constant leakage current and a constant "ON" resistance. The EFET gate and substrate capacitance is isolated from external circuitry and circuit board capacitance. GaAs MESFET leakage currents are isolated from other circuitry using low bipolar leakage switch control circuits.

When using the biasing scheme, the "OFF" leakage of the EFETs have exhibited less than 100 pA leakage from 25 Degree C. to 50 degree C. GaAs MESFETs have exhibited less than 2 ohms "ON" resistance. The bipolar transistors have exhibited less than 10 pA leakage at the collector from 25 degree C. to 80 degree C. when the base-emitter junction is reverse biased.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

The use of FETs to eliminate relays and shorten the distance between the DUT output and the receiver includes two different types of FET switch circuit applications. EFETs are used for high bandpass isolation switches and GaAs MESFETs are used for the high speed driver and load switches.

Figure 1:
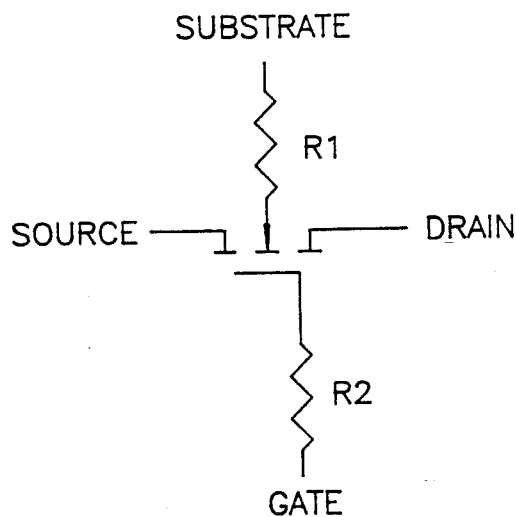
FIG. 1 illustrates an example of an EFET isolation switch.

Referring to FIG. 1, the design features of the EFET isolation switches are as follows.

The EFET gate and substrate are isolated from the other components and the distributed capacitance of the printed wiring board by series resistors R1 and R2. Since the gate and substrate are isolated from the other components, the only capacitance that is significant is the feed through capacitance of the EFET. This feed through capacitance (capacitance from the drain to the source) increases the bandpass of the EFET switch in the "ON" state. The isolation resistors, R1 and R2, are large with respect to the 50 ohm impedance of the transmission line. Resistors R1 and R2 are on the order of 50k ohm to 1 megohms. The insertion losses of the EFETs will be (R1+50 ohm)/50 ohm. This is 0.1% error for R1=50k.

The leakage current of an EFET changes with the source to substrate voltage, or the drain to substrate voltage. The leakage current also changes with the gate to source voltage, or gate to drain voltage. To maintain a constant leakage current, the bias conditions of the FET must remain constant. To keep the bias conditions constant, the biasing of the EFET must track the applied voltage at the drain and source.

The substrate of the EFET is biased at a nominal voltage below the source of the EFET in the "OFF" and "ON" condition. The gate of the EFET is biased to a nominal voltage above the source in the "ON" condition, and to a nominal voltage below the source in the "OFF" condition. The voltage on the gate and substrate tracks the voltage at the source of the EFET. Since the gate and substrate are biased relative to the source voltage, the "ON" resistance from the source to drain also is constant.

Figure 2:
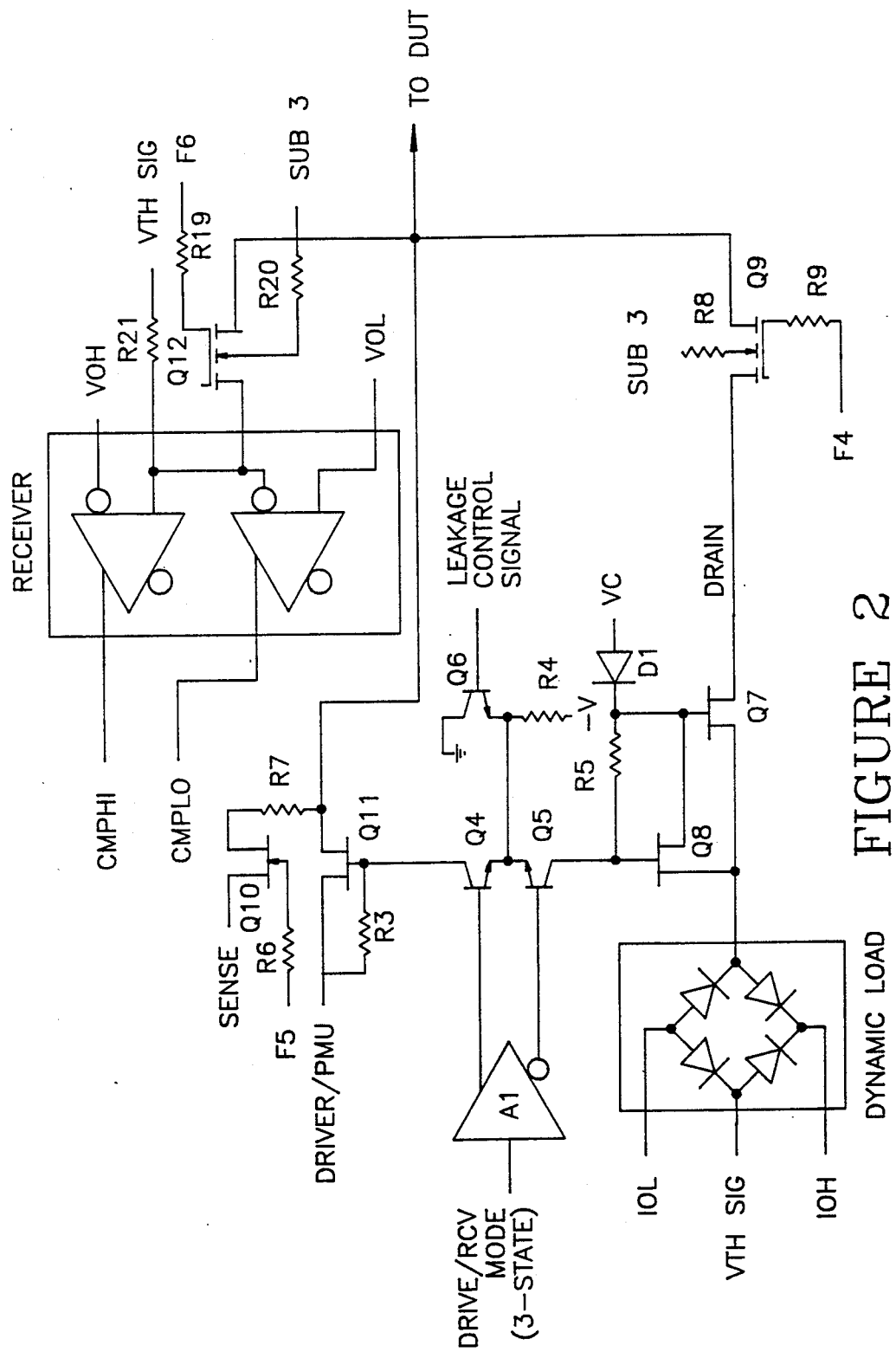
FIG. 2 illustrates an example of a FET matrix front end for a device under test I/F tester.

The design features of the high speed FET matrix front end are illustrated in FIG. 2. The FET matrix front end is the interface from the tester to the device under test. The FET matrix front end includes the pin electronic functions that must be close to the DUT. These functions are the receiver, dynamic load, and high speed switches to connect and disconnect the DRIVER and Load to the DUT. These functions must be located in the Test Head. The high speed switches are implemented with GaAs MESFETs.

The GaAs MESFETs have very fast "turn-on" and "turn-off" times. This is due to the very low capacitance between the drain to gate and source to gate, and driving the MESFET gates differentially. The driver switch is formed by Q11 and R3. Using a remote, high speed driver disconnect switch allows placement of most of the driver circuitry out of the testhead. This reduces the overall circuitry in the testhead resulting in a shorter distance to the DUT and a smaller testhead design. The driver MESFET Q11 gate has very low leakage in the "ON" state due to the unique reverse biasing of the bipolar NPN transistors Q5 and Q6. The leakage current of a GaAs MESFET gate is high, but the leakage from the gate to the drain and source does not affect the over-all leakage current since the leakage current does not escape the same signal path.

The leakage current from the MESFET gate to the bipolar transistor Q4 is a concern. The leakage current into the collector of Q4 is controlled by reverse biasing the base to emitter. Reverse biasing the base and emitter turns the transistor off hard, and controls the leakage current of the collector to less than 10 pa (based on experiential results). When the voltage at the base of Q6 is 1v greater than the base voltage of Q4 and Q5, the base emitter junction of Q5 and Q6 is reverse biased in the low leakage mode.

Q7, and Q8 and D1 form a very high speed analog switch with a wide voltage range. The voltage range is limited by the drain to gate breakdown voltage of Q7 and Q8. The leakage of this switch in the "ON" state is controlled by the leakage of the cathode of D1 and the collector leakage of Q5. Diode D1 can be chosen to be a low leakage diode. The collector leakage of Q5 is controlled by reverse biasing the base to emitter as stated above.

The load switch formed by Q7, Q8 and D1 can also be used for the Driver switch. D.C. measurements are made using a Parametric Measurement Unit (PMU) in a Test System. The low leakage of the Driver switch is necessary when the PMU is connected through the DRIVER/PMU path to the DUT. By design, the PMU is capable of forcing and measuring very low currents to the DUT through the DRIVER/PMU Path. The critical interconnection paths from FIG. 2 to FIG. 3 are DRIVER/PMU and SENSE.

FIG. 2 contains the pin electronic functions that must be in the Test Head close to the DUT.

Figure 3:
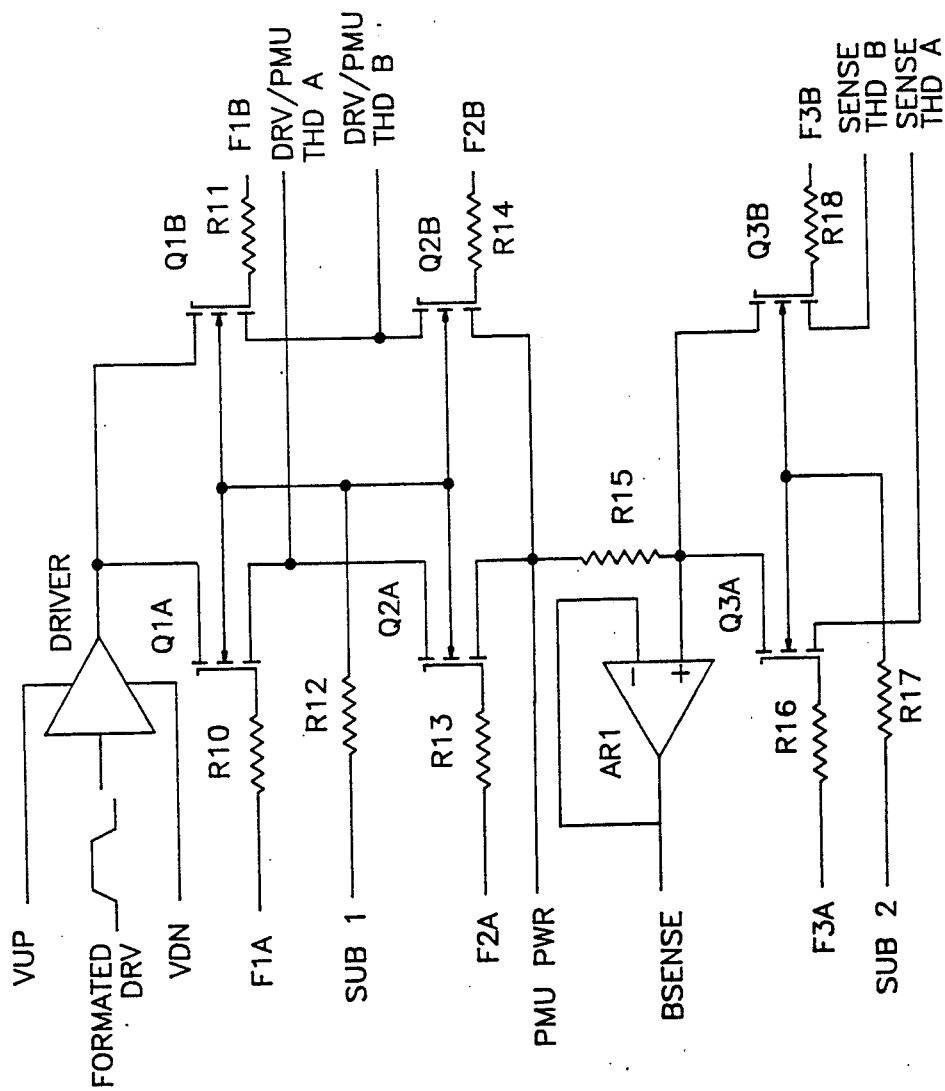
FIG. 3 illustrates an example of a FET matrix back end (Driver and PMU switching)

FIG. 3 contains the pin electronic functions (Driver and PMU) that do not need to be close to the DUT.

FIG. 3 illustrates how the DRIVER and PMU can be multiplexed between two Test Heads. Q1a, Q1b, Q2a, and Q2b are used for switching the driver and PMU (Parametric Measuring Unit) between two testheads. Testhead multiplexing allows time sharing of the expensive hardware in the mainframe and still preserves the integrity of the driver path and accuracy of the PMU. The voltage at the source of Q1a and Q1b is the output voltage of the DRIVER. The voltage at the source of Q2a and Q2b is the output voltage of the PMU.

The output voltage of the PMU is sensed and buffered through an opamp AR1. The output of AR1 (BSENSE) is the reference voltage for the biasing of the PMU PWR switches (Q2a and Q2b) gates. The substrate of Q1a, Q1b, Q2a and Q2b (SUB 1) is biased relative to the output voltage of the driver. The gates of the driver EFET switches (Q1a and Q1b gates) are biased relative to the output of the driver.

Figure 4:
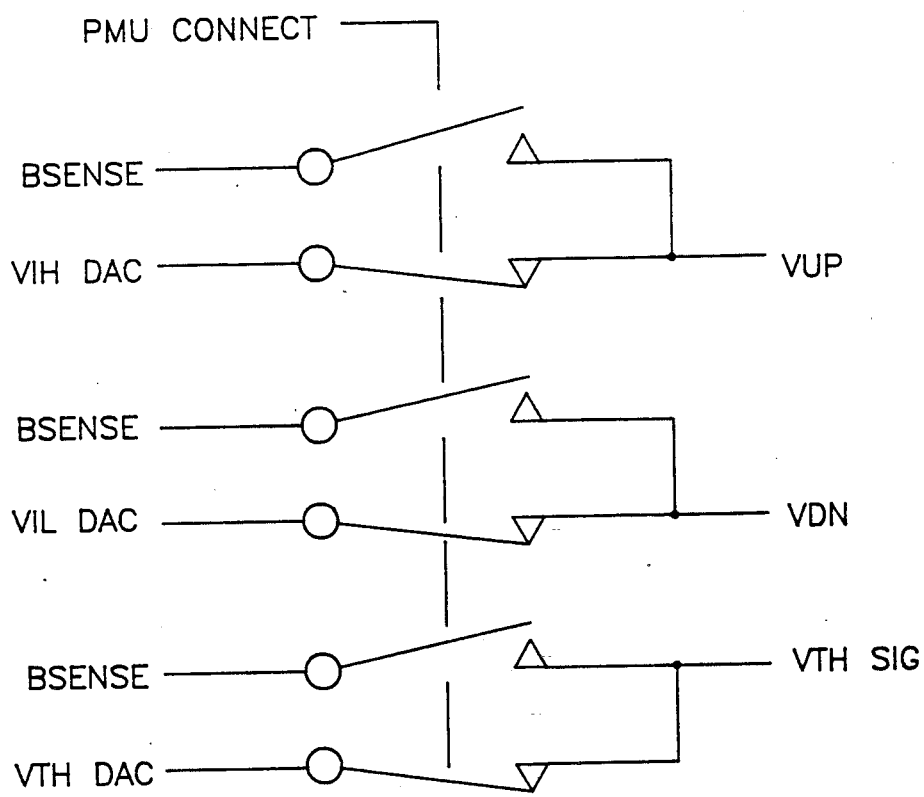
FIG. 4 illustrates connection of BSENSE to the VTH signal path and BSENSE connected to Driver Inputs through analog switches.

When a PMU switch (Q2a or Q2b) is connected, the driver inputs are connected to BSENSE with an analog switch. (See FIG. 4). With the EFETs (Q1a, Q1b, Q2a, and Q2b) biased relative to BSENSE, the leakage current of these EFETs remains constant relative to the output voltage of the PMU.

The "ON" resistance of Q1a or Q1b EFETs is included in the 50 ohm series termination of the driver. Since the gate and substrate are bias relative to the output of the driver, the "ON" resistance of the EFETs remains constant relative to the output voltage of the driver.

Q3a and Q3b EFETs multiplex the PMU SENSE to the DUT at testhead A or testhead B. The PMU SENSE is Kelvin connected at the DUT for programmed and measured voltage accuracy. FETs Q3a and Q3b are bias relative to BSENSE.

Resistors R10 through R14 are used to isolate the capacitance of the printed circuit board and other components from the critical driver path. Resistor R15 connects the PMU PWR and SENSE together when the PMU switches (Q2a and Q3a) or (Q2b and Q3b) are not closed. Resistors R16 through R18 are used to isolate the capacitance of the SENSE signal path from the printed circuit board and other components.

When a PMU switch (Q2a or Q2b) is on, BSENSE is connected to the VTH signal path through an analog switch. VTH is normally used to define the commutating voltage of the dynamic programmable load circuit, however, it is available for alternate uses during PMU operation since the dynamic load is not used during this time. This unique biasing scheme uses the voltage on the VTH signal path to reference the biasing of the EFETs and JFET (Junction FET) in the testhead (see FIGS. 2 and 4).

Referring again to FIG. 2, the EFET Q9 isolates the dynamic load when the PMU is connected to the DUT. EFET Q12 isolates the input bias current of the receiver when the PMU is connected. As stated before, the EFETs are biased relative to VTH signal, and the VTH signal path is connected to BSENSE when the PMU is connected to the DUT. Resistors R8, R9, R19 and R20 are used to isolate the capacitance of the PWB and other components from the critical driver and load paths.

The JFET Q10 is used to isolate the SENSE path from the driver path when the PMU is not connected. Resistor R6 minimizes the lumped capacitance on the SENSE path and on the driver path. The gate of Q10 JFET is biased relative to the VTH signal path. When Q10 is "ON", the gate voltage is equal to BSENSE. The PMU switches are "OFF" when Q10 is off. Therefore, Q10 gate is biased a nominal voltage below VTH DAC in the "OFF" state.

Utilization of FETs as described above replaces the relay matrix normally used in integrated circuit testers. The use of FETs minimizes the distance from the DUT to the receiver, eliminates insertion losses of relays in the critical high integrity paths, eliminates relays in the high usage paths, and allows multiplexing between testheads in a test system without the use of relays.

What is claimed is:

1. An interconnection circuit in a semiconductor test system between the device under test and the tester pin electronics, comprising:
   at least one field effect transistor, having source, drain and gate connections, forming a high bandpass, low leakage switch; and
   wherein substrate biasing of the field effect transistor, forming the high bandpass, low leakage switch, tracks the voltage on the source and/or drain connections.

2. The interconnection circuit according to claim 1, including a resistor isolating the gate of the field effect transistor, forming the high bandpass, low leakage switch, from connected circuitry.

3. The interconnection circuit according to claim 1, wherein the field effect transistor, forming the high bandpass, low leakage switch, has a substrate connection separate from the source, drain and gate connections, and a resistor is used to isolate the substrate of the field effect transistor from connected circuitry.

4. The interconnection circuitry according to claim 1, wherein gate biasing of the field effect transistor, forming the high bandpass, low leakage switch, tracks the voltage on the source and/or drain connections.

5. The interconnection circuitry according to claim 1, including a field effect transistor switching matrix to multiplex the tester pin electronics between two devices under test.

6. In a semiconductor test system, an interconnection circuit between the device under test and the tester pin electronics circuits including the test load, comprising:
   a field effect transistor connected between the test system test load circuit and the device under test;
   a second field effect transistor connected between the field effect transistor gate and source connections to control the state of the field effect transistor;
   a current switch circuit connected to the gate of the second field effect transistor to further control the state of the field effect transistor and to control leakage currents; and
   a third field effect transistor, forming a high bandpass, low leakage switch having its source connected to the drain of said field effect transistor; and
   wherein substrate biasing of the third field effect transistor tracks the voltage on the source and/or drain connections.

7. The interconnection circuit according to claim 6, wherein the load switch circuit includes at least one bipolar transistor.

8. The interconnection circuitry according to claim 7, including at least one bipolar transistor, wherein the base/emitter junctions of the bipolar transistor is reversed biased to control leakage current of the load switch.

9. An interconnection circuit in a semiconductor test system between the device under test and the tester pin electronics, comprising:
   at least one field effect transistor, having source, drain and gate connections, forming a high bandpass, low leakage switch;
   at least one field effect transistor, having source, drain and gate connections, forming a high speed driver switch, the drain of which is connected to the drain of the high bandpass, low leakage switch;
   at least one field effect transistor having source, drain and gate connections forming a high speed load switch, the drain of which is connected to the source of said high bandpass, low leakage switch; and
   including at least first and second bipolar transistors, having collector, emitter and base connections, used to control the state of the high speed driver and load switches, wherein the base/emitter junctions of the bipolar transistors are reversed biased to control leakage current of the driver switch, the collector of said first bipolar transistor connected to the gate of said high speed driver switch; and
   wherein substrate biasing of the field effect transistor, forming the high bandpass, low leakage switch, tracks the voltage on the source and/or drain connections.

10. The interconnection circuit according to claim 9, including a resistor isolating the gate of the field effect transistor, forming the high bandpass, low leakage switch, from connected circuitry.

11. The interconnection circuit according to claim 9, wherein the field effect transistor, forming the high bandpass, low leakage switch, has a substrate connection separate from the source drain and gate connections, and a resistor is used to isolate the substrate of the field effect transistor from connected circuitry.

12. The interconnection circuitry according to claim 9, wherein gate biasing of the field effect transistor, forming the high bandpass, low leakage switch, tracks the voltage on the source and/or drain connections.

13. The interconnection circuitry according to claim 9, wherein the high bandpass, low leakage switch includes two field effect transistors having drain connections connected together and substrate biasing of the field effect transistors, forming the high bandpass, low leakage switch, tracks the voltage on the source and/or drain connections.

14. The interconnection circuitry according to claim 9, wherein the gate and source connections of the driver switch are connected together by a resistor.

15. The interconnection circuitry according to claim 9, wherein a second field effect transistor is used to connect the gate and source of the load switch to increase switching speed of the switch.

16. The interconnection circuitry according to claim 9, including a field effect transistor switching matrix to multiplex the tester pin electronics between two devices under test.

17. The interconnection circuit according to claim 16, wherein the multiplex circuit includes two field effect transistors connected to allow time sharing between the tester pin electronics and two different testheads.

* * * * *